United States Patent
Colbert et al.

(10) Patent No.: US 9,265,157 B2
(45) Date of Patent: Feb. 16, 2016

(54) IMPLEMENTING HEAT SINK LOADING HAVING MULTIPOINT LOADING WITH ACTUATION OUTBOARD OF HEATSINK FOOTPRINT

(71) Applicant: International Business Machines Corporation, Armonk, NY (US)

(72) Inventors: John L. Colbert, Byron, MN (US); Jason R. Eagle, Kasson, MN (US); Roger D. Hamilton, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 13/796,323

(22) Filed: Mar. 12, 2013

(65) Prior Publication Data

US 2014/0268575 A1    Sep. 18, 2014

(51) Int. Cl.
*H05K 7/20* (2006.01)
*H05K 3/30* (2006.01)
*H01L 23/40* (2006.01)

(52) U.S. Cl.
CPC ........... *H05K 3/303* (2013.01); *H01L 23/40* (2013.01); *H01L 23/4006* (2013.01); *H01L 2924/0002* (2013.01); *Y10T 29/49117* (2015.01)

(58) Field of Classification Search
None
See application file for complete search history.

(56) References Cited

U.S. PATENT DOCUMENTS

| | | | |
|---|---|---|---|
| 5,933,325 A * | 8/1999 | Hou | 361/704 |
| 6,634,890 B2 | 10/2003 | Peterson et al. | |
| 6,644,387 B1 * | 11/2003 | Lee et al. | 165/80.3 |
| 6,724,629 B1 | 4/2004 | Augustin et al. | |
| 7,215,550 B1 * | 5/2007 | Yang et al. | 361/704 |
| 7,321,492 B2 * | 1/2008 | Wang et al. | 361/709 |
| 7,344,384 B2 | 3/2008 | Rubenstein et al. | |
| 7,746,646 B2 * | 6/2010 | Kuo et al. | 361/709 |
| 7,755,896 B2 * | 7/2010 | Tamaki et al. | 361/704 |
| 8,125,782 B2 * | 2/2012 | Azar et al. | 361/709 |
| 8,149,580 B2 * | 4/2012 | Yu et al. | 361/710 |
| 8,274,793 B2 * | 9/2012 | Wang et al. | 361/709 |

OTHER PUBLICATIONS

"Assembly of MCM Thermal Solution Utilizing Individual Heat Spreaders", by David L. Edwards et al., 22nd IEEE SEMI-THERM Symposium, pp. 157-161 2006.

* cited by examiner

*Primary Examiner* — Courtney Smith
(74) *Attorney, Agent, or Firm* — Joan Pennington

(57) ABSTRACT

A method and apparatus are provided for implementing enhanced heat sink loading for cooling an electronic module having one or more semiconductor chips. The apparatus includes an electronic module having one or more semiconductor chips; a heat sink; a heat sink load bearing member further comprising raised points; a load spring passing through the heat sink, the load spring having a latch arm at a first end and a load screw at a second end actuating the load spring, the load spring when actuated is configured to bear against the raised points to equalize pressure distribution over one or more semiconductor chips on the electronic module.

14 Claims, 10 Drawing Sheets

IMPLEMENTING HEAT SINK LOADING HAVING MULTIPOINT LOADING WITH ACTUATION OUTBOARD OF HEATSINK FOOTPRINT

FIELD OF THE INVENTION

The present invention relates generally to the data processing field, and more particularly, relates to method and apparatus for implementing enhanced heat sink loading for cooling a module having one or more semiconductor chips.

DESCRIPTION OF THE RELATED ART

Cooling or heat sink solutions for multiple chip electronic modules are limited. Enabling load to be focused over specific points on a heat sink is especially desirable for multichip modules. Some heat sink solutions rely on heat spreaders or thick thermal pads intending that the load be will spread between points in a manner that is desirable.

A need exists for an efficient and effective method and apparatus for implementing heat sink loading that enables multipoint loading. It is desirable to provide such method and apparatus with structures that have enhanced heat conducting capability.

SUMMARY OF THE INVENTION

Principal aspects of the present invention are to provide a method and apparatus for implementing enhanced heat sink loading for cooling a module having one or more semiconductor chips. Other important aspects of the present invention are to provide such method and apparatus substantially without negative effects and that overcome many of the disadvantages of prior art arrangements.

In brief, a method and apparatus are provided for implementing enhanced heat sink loading for cooling an electronic module having one or more semiconductor chips. The apparatus includes an electronic module having one or more semiconductor chips; a heat sink; a heat sink load bearing member further comprising raised points; a load spring passing through the heat sink, the load spring having a latch arm at a first end and a load screw at a second end actuating the load spring, the load spring when actuated is configured to bear against the raised points to equalize pressure distribution over one or more semiconductor chips on the electronic module.

In accordance with features of the invention, the raised points are positioned over one or more semiconductor chips to distribute pressure and deflection of a heat sink base with a predefined bearing load, providing improved cooling properties.

In accordance with features of the invention, the heat sink base formed of a highly thermally conductive material.

In accordance with features of the invention, the load screw at the second end of the load spring enables actuation outboard of a heat sink footprint and this access is visible to the operator.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing enhanced heat sink loading for cooling a module having one or more semiconductor chips.

Figure 1A:
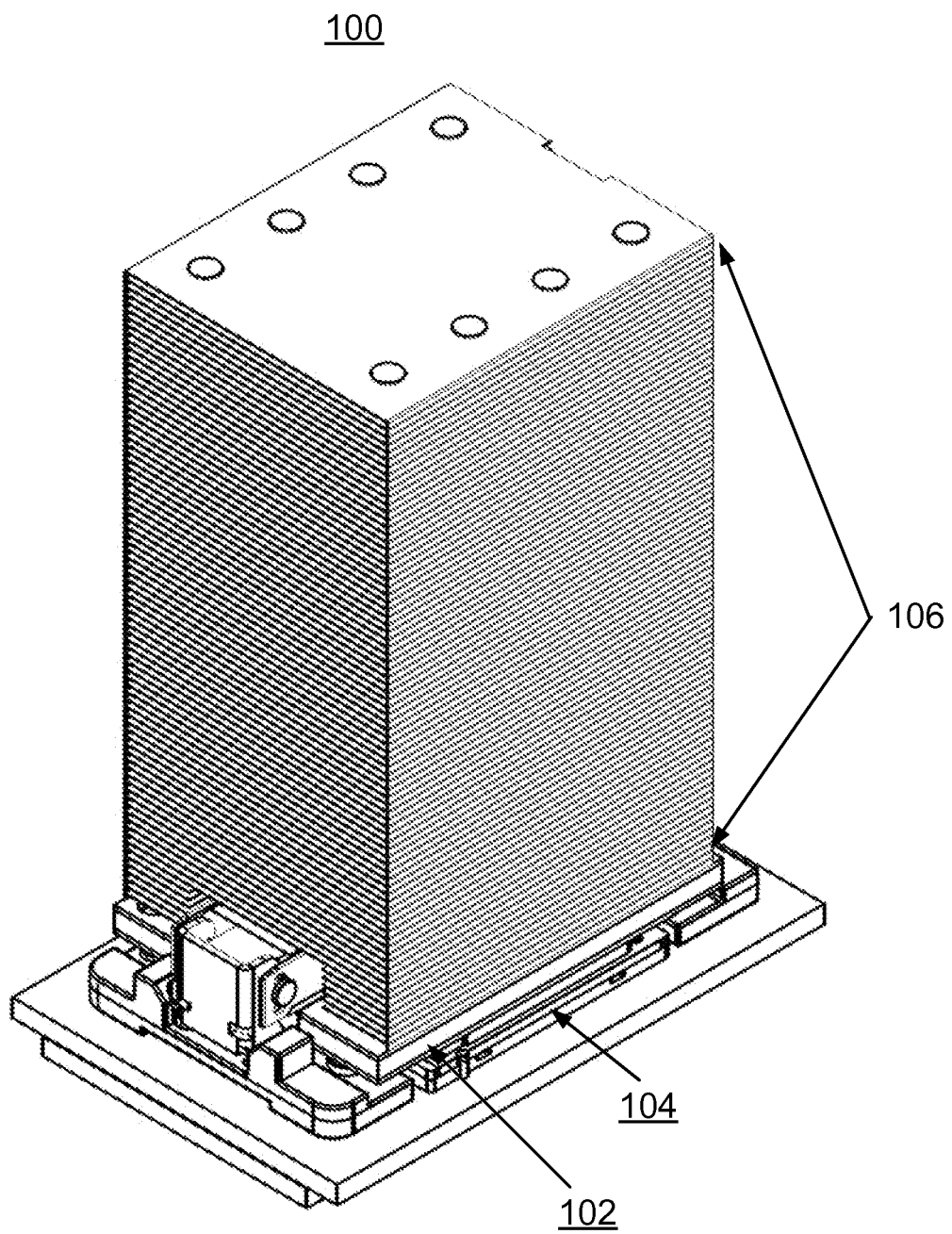
FIGS. 1A, 1B, and 1C are perspective views not to scale illustrating example apparatus for implementing enhanced heat sink loading for cooling a module having one or more semiconductor chips in accordance with the preferred embodiment.
Figure 1B:
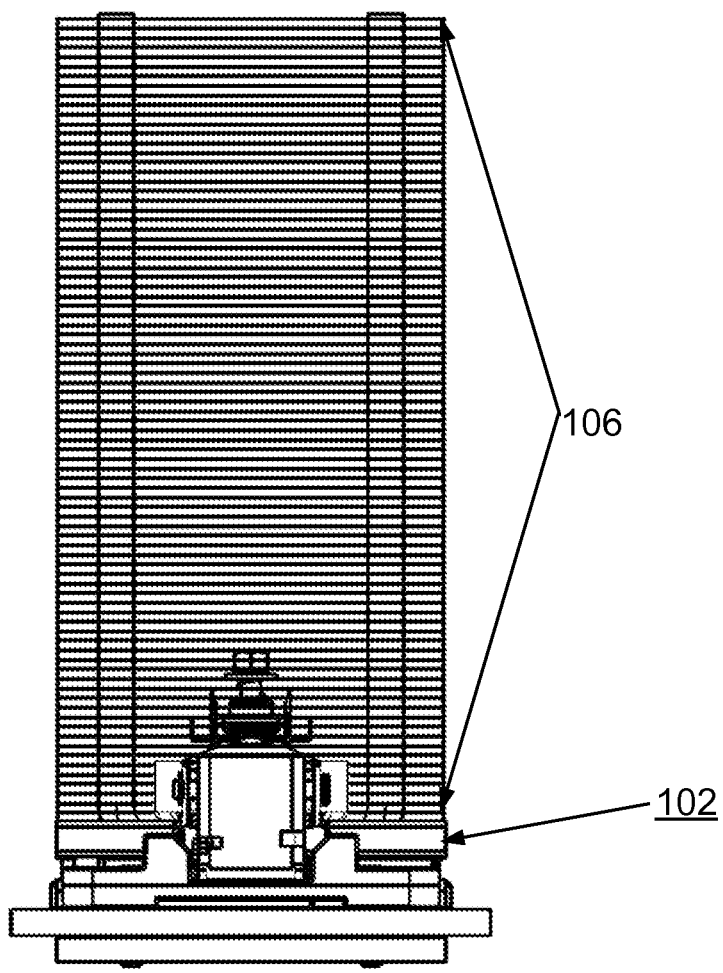
Figure 1C:
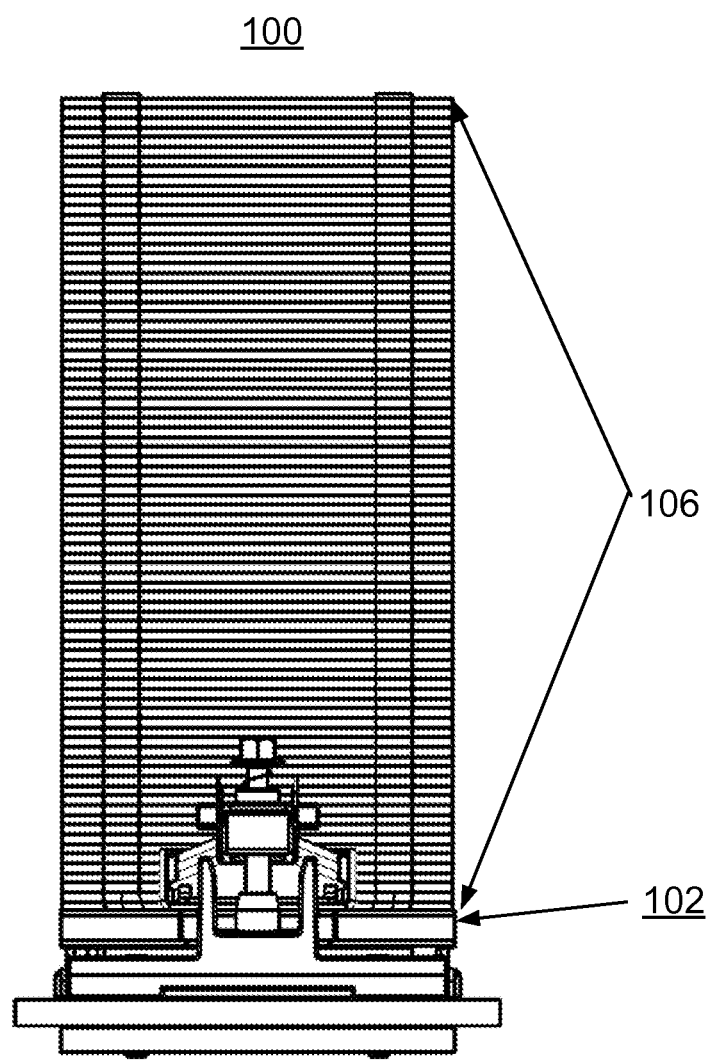

Referring now to FIGS. 1A, 1B, and 1C, there are shown perspective views not to scale illustrating example apparatus generally designated by the reference character 100 for implementing enhanced heat sink loading for cooling a electronic module having one or more semiconductor chips in accordance with the preferred embodiment.

In FIGS. 1A, 1B, and 1C, apparatus 100 includes a cooling or heat sink assembly generally designated by the reference character 102 for cooling an electronic module assembly generally designated by the reference character 104 and a stack of numerous horizontally extending fins 106. A side perspective view of apparatus 100 is shown in FIG. 1A. A front view of apparatus 100 is shown in FIG. 1B. A back view of apparatus 100 is shown in FIG. 1C.

Figure 2A:
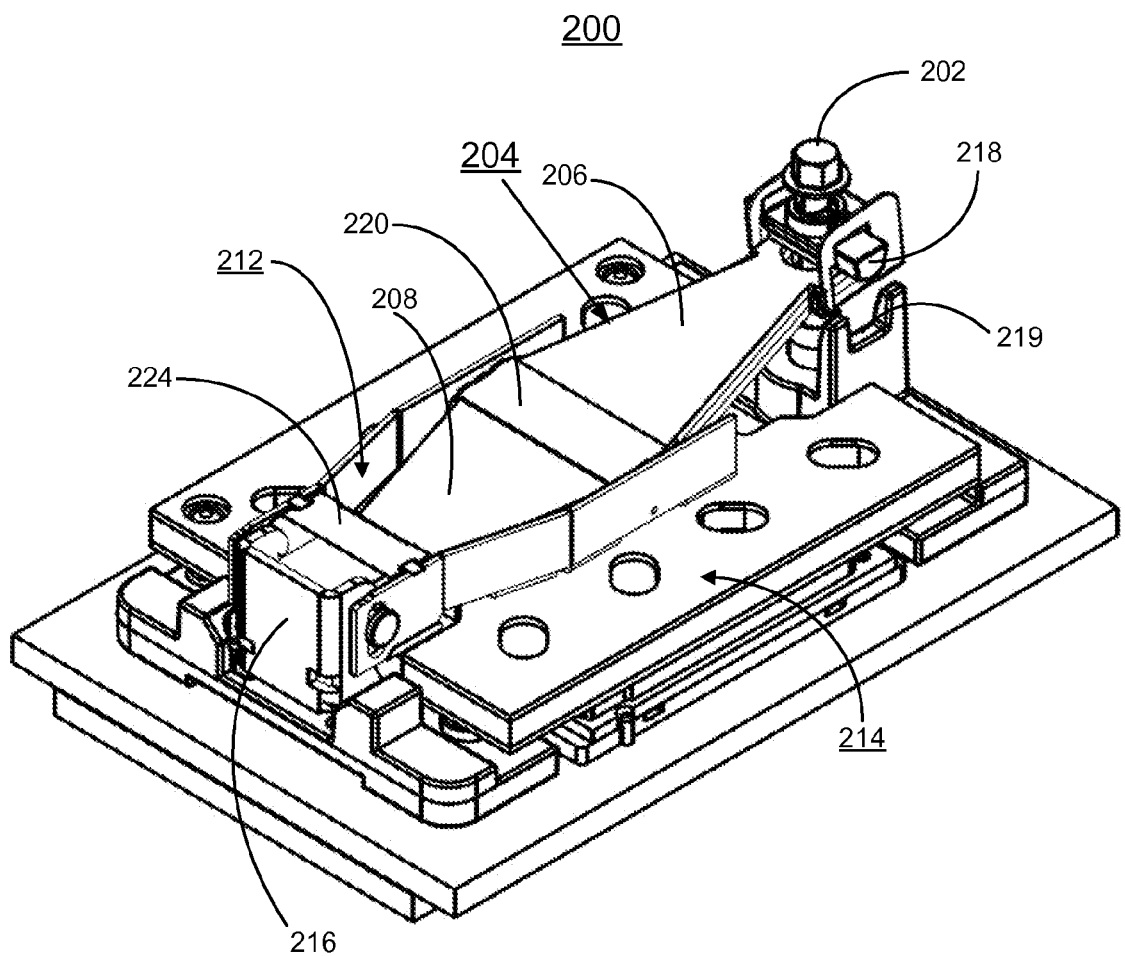
FIGS. 2A, 2B, and 2C are respective views not to scale schematically illustrating example heat sink and retention hardware assembly of the apparatus of FIGS. 1A, 1B, and 1C for implementing enhanced heat sink loading for cooling a module having one or more semiconductor chips in accordance with the preferred embodiment.
Figure 2B:
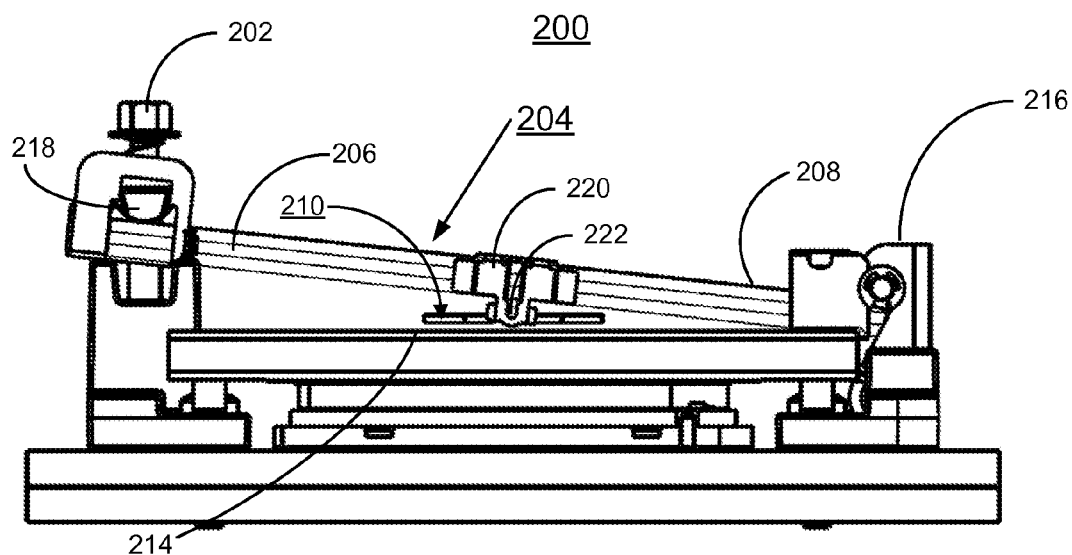
Figure 2C:
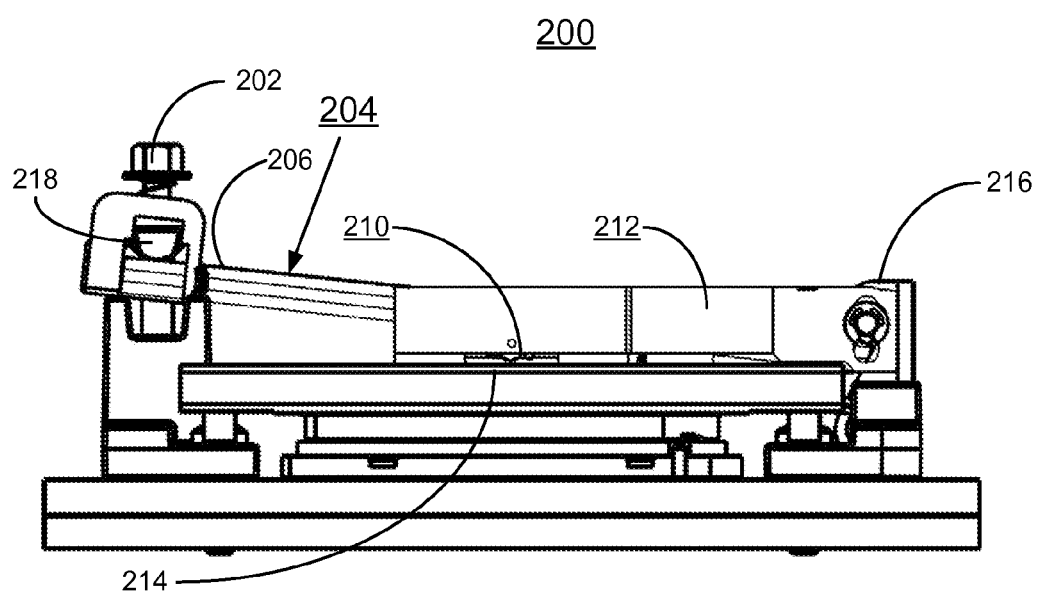
Figure 2D:
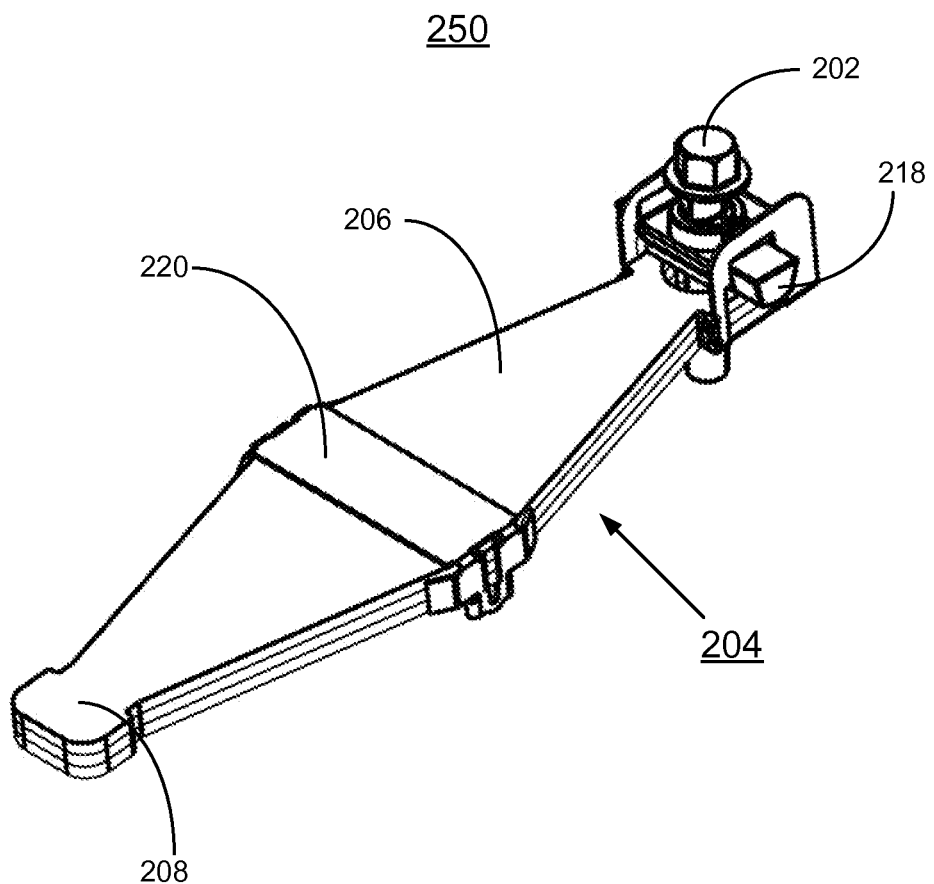
FIG. 2D is a view not to scale schematically illustrating a load spring assembly of the apparatus of FIGS. 1A, 1B, and 1C for implementing enhanced heat sink loading for cooling a module having one or more semiconductor chips in accordance with the preferred embodiment.

In accordance with features of the invention, the heat sink assembly 102 includes a heat sink and retention hardware assembly generally designated by the reference character 200 as illustrated and described with respect to FIGS. 2A, 2B, and 2C and a load spring assembly generally designated by the reference character 250 as illustrated and described with respect to FIG. 2D.

Referring also to FIGS. 2A, 2B, 2C, heat sink and retention hardware assembly 200 includes a load screw 202 provided with a load spring generally designated by the reference character 204. The load spring 204 passing through the heat sink assembly 102 is adapted to be actuated at a first end 206, and latched at a second end 208.

Referring also to FIG. 2D, load spring assembly 250 includes the load screw 202 provided with the load spring 204. Load spring 204 includes the end portion 206 engaged by the load screw 202.

In accordance with features of the invention, the load screw 202 provided with the load spring 204 is located outboard of a heat sink footprint and this access is visible to the operator. This eliminates the need to cut holes through heat sink fins 106 for load screw access, while advantageously making this access visible to the operator.

Figure 3A:
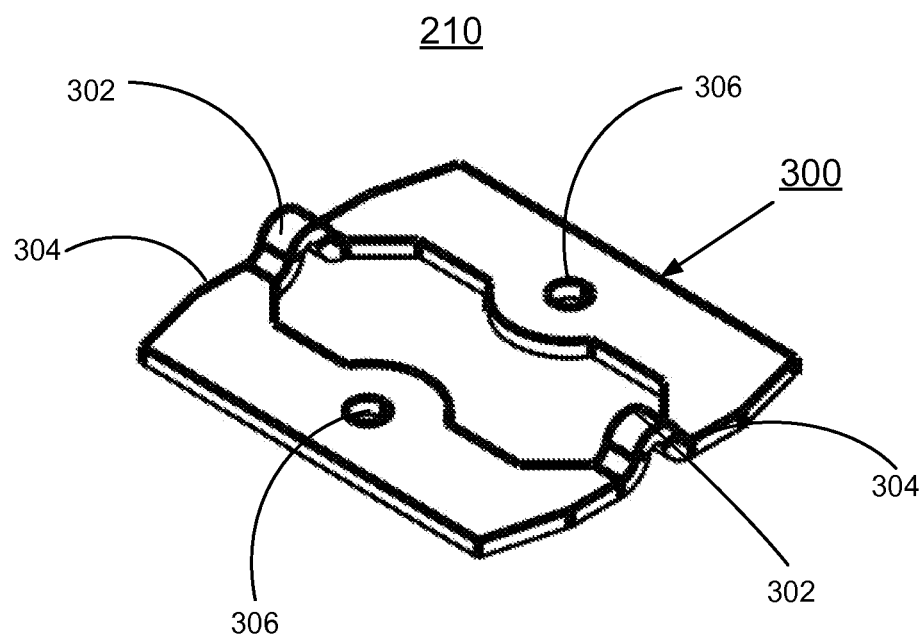
FIGS. 3A, 3B, and 3C are respective perspective views not to scale schematically illustrating an example heat sink load bearing member, spring retention channel and heat sink base of the apparatus of FIGS. 1A, 1B, and 1C for implementing enhanced heat sink loading for cooling a module having one or more semiconductor chips in accordance with the preferred embodiment.
Figure 3B:
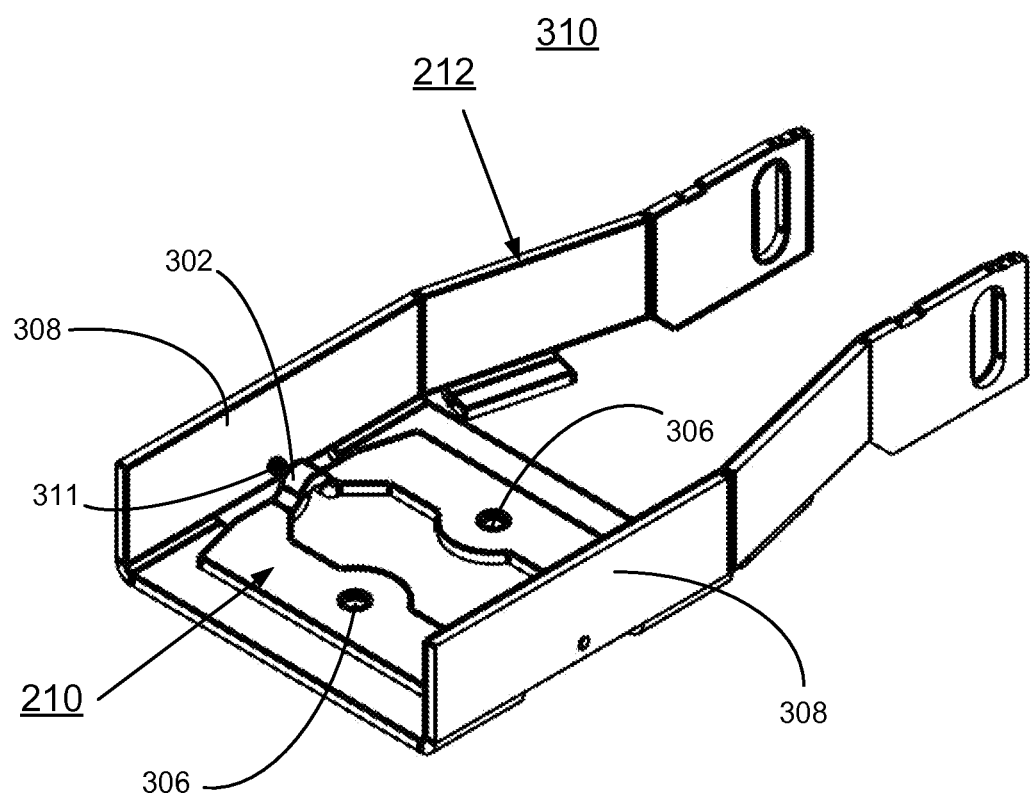
Figure 3C:
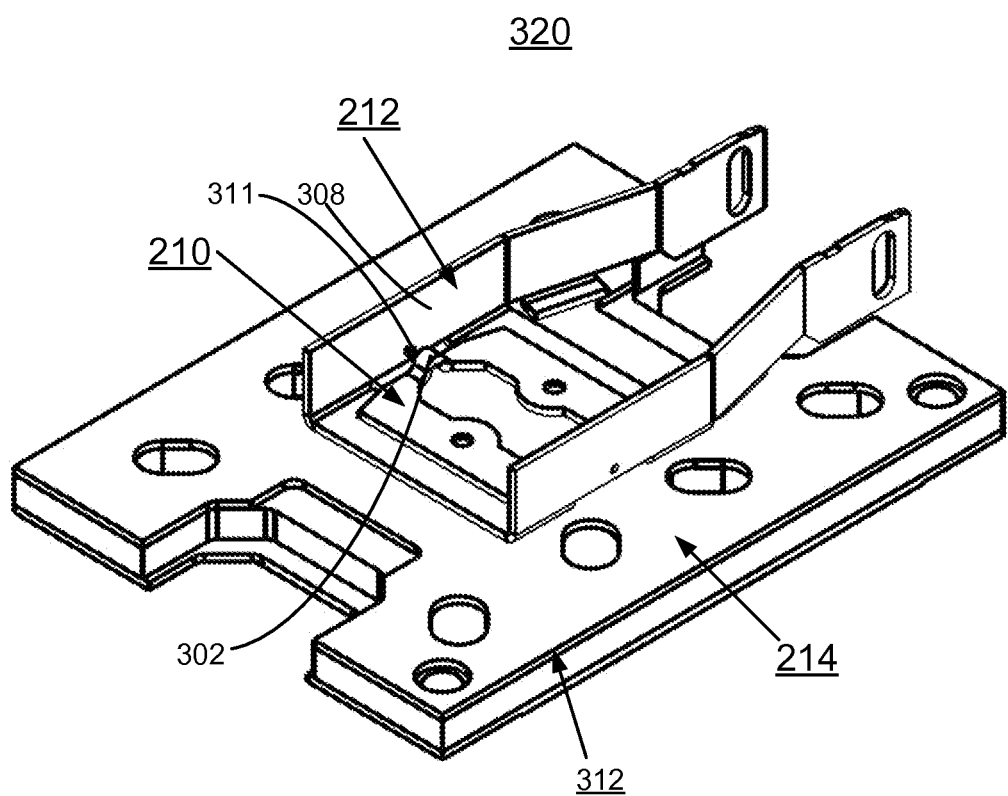

In accordance with features of the invention, the heat sink and retention hardware assembly 200 incorporates the load spring 204 that bears on points 302 integrated into a heat sink load bearing member 210, as shown in FIGS. 3A, 3B, 3C. These support points 302 can be positioned to distribute pressure and deflection of a heat sink base 214 in a desirable fashion. This results in a more even pressure distribution on multichip modules, which in turn provides improved cooling properties.

Heat sink and retention hardware assembly 200 includes the heat sink load bearing member 210, a spring retention channel 212, and a heat sink base 214, which are further illustrated and described with respect to FIGS. 3A, 3B, and 3C. Heat sink and retention hardware assembly 200 includes a latch arm 216 at the end 208 of the load spring 204. Heat sink and retention hardware assembly 200 includes the load screw 202 at the end 206 of the load spring 204 with a cross piece 218 received in a down stop yoke 219 engaging the load screw. A generally centrally keeper 220 retains together multiple layer of the load spring 204 and includes a mounting feature 222 provided proximate the heat sink load bearing member 210, which is shown in FIG. 3B. A member 224 is a flat spring that maintains the end 208 of the load spring 204 tilted or low to facilitate engaging the latch arm 216.

Referring now to FIGS. 3A, 3B, and 3C, the example heat sink load bearing member 210, spring retention channel 212, and heat sink base 214 of the apparatus 100 are shown in accordance with the preferred embodiment.

As shown in FIG. 3A, the heat sink load bearing member 210 includes an overall generally rectangular shape generally designated by the reference character 300 further comprises raised points 302 formed generally centrally located along opposed side 304 of the heat sink load bearing member 210. The heat sink load bearing member 210 includes a pair of alignment openings 306 used for assembly of heat sink load bearing member 210 within the heat sink and retention hardware assembly 200.

In accordance with features of the invention, the load spring 204 when actuated is configured to bear against the raised points 302 to equalize pressure distribution over one or more semiconductor chips on the electronic module.

FIG. 3B illustrates an assembly generally designated by the reference character 310 of the heat sink load bearing member 210 and the spring retention channel 212. The spring retention channel 212 includes opposing sidewalls 308 with the heat sink load bearing member 210 received between the sidewalls 308. The spring retention channel 212 includes a pair of mounting features 311 formed in sidewalls 308 retains the spring assembly (not shown in FIG. 3B), providing pivot points.

FIG. 3C illustrates an assembly generally designated by the reference character 320 of the heat sink load bearing member 210, spring retention channel 212, and the heat sink base 214. The heat sink base 214 includes predefined configuration generally designated by the reference character 312.

While the present invention has been described with reference to the details of the embodiments of the invention shown in the drawing, these details are not intended to limit the scope of the invention as claimed in the appended claims.

What is claimed is:

1. An apparatus for implementing enhanced heat sink loading for cooling an electronic module comprising:
   an electronic module having multiple semiconductor chips;
   a heat sink;
   a heat sink load bearing member further comprising raised points;
   a load spring passing through the heat sink, said load spring having a latch arm at a first end and a load screw at a second end actuating said load spring, said load spring when actuated bearing against the raised points to equalize pressure distribution over one or more chips on the multiple chip electronic module; and said raised points being positioned over the one or more semiconductor chips to distribute pressure and deflection of a heat sink base with a predefined bearing load, providing improved cooling properties.

2. The apparatus as recited in claim 1 wherein said heat sink includes a heat sink base formed of a highly conductive material.

3. The apparatus as recited in claim 2 wherein said highly conductive material includes aluminum and copper.

4. The apparatus as recited in claim 1 includes highly conductive horizontally extending fins.

5. The apparatus as recited in claim 1 wherein said heat sink includes a predefined heat sink footprint and said load screw at the second end of said load spring enables actuation outboard of said heat sink footprint.

6. The apparatus as recited in claim 1 wherein said load screw is visible to a user operator.

7. The apparatus as recited in claim 1 wherein said load spring includes formed steel features for retaining said load spring.

8. A method for implementing enhanced heat sink loading for cooling a module comprising:
   providing an electronic module having multiple semiconductor chips;
   providing a heat sink, and a heat sink load bearing member further comprising raised points;
   passing a load spring through the heat sink, said load spring adapted to be actuated at both ends, said load spring having a latch arm at a first end and said load spring having a load screw at a second end, and actuating said load spring with said load spring bearing against the raised points to equalize pressure distribution over one or more semiconductor chips on the multiple chip electronic module; and
   providing said raised points positioned over the one or more semiconductor chips to distribute pressure and deflection of a heat sink base with a predefined bearing load, providing improved cooling properties.

9. The method as recited in claim 8 includes forming a heat sink base of said heat sink of a highly conductive material.

10. The method as recited in claim 9 wherein said highly conductive material includes aluminum and copper.

11. The method as recited in claim 8 includes providing a stack of highly conductive horizontally extending fins with said heat sink.

12. The method as recited in claim 8 includes providing said load spring with formed steel features for retaining said load spring.

13. The method as recited in claim 8 includes providing said heat sink with a predefined heat sink footprint and locating said load screw at the second end of said load spring outboard of said heat sink footprint.

14. The method as recited in claim 13 includes providing said load screw visible to a user operator.

* * * * *